(12) United States Patent
Nawaz et al.

(10) Patent No.: US 9,412,869 B2
(45) Date of Patent: Aug. 9, 2016

(54) MOSFET WITH SOURCE SIDE ONLY STRESS

(71) Applicant: Texas Instruments Incorporated, Dallas, TX (US)

(72) Inventors: Samuel Zafar Nawaz, Plano, TX (US); Shaofeng Yu, Plano, TX (US); Jeffrey E. Brighton, Dallas, TX (US); Song Zhao, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/559,451

(22) Filed: Dec. 3, 2014

(65) Prior Publication Data

US 2015/0087127 A1 Mar. 26, 2015

Related U.S. Application Data

(62) Division of application No. 13/288,170, filed on Nov. 3, 2011, now Pat. No. 8,928,047.

(60) Provisional application No. 61/409,586, filed on Nov. 3, 2010.

(51) Int. Cl.
*H01L 29/78* (2006.01)
*H01L 29/66* (2006.01)
*H01L 29/165* (2006.01)

(52) U.S. Cl.
CPC .......... *H01L 29/7848* (2013.01); *H01L 29/165* (2013.01); *H01L 29/66636* (2013.01); *H01L 29/66659* (2013.01); *H01L 29/7835* (2013.01)

(58) Field of Classification Search
None
See application file for complete search history.

(56) References Cited

U.S. PATENT DOCUMENTS

| | | | |
|---|---|---|---|
| 2005/0035409 A1* | 2/2005 | Ko | H01L 21/26506 257/350 |
| 2006/0006461 A1* | 1/2006 | Chidambaram | 257/341 |
| 2006/0255415 A1* | 11/2006 | Freeman et al. | 257/408 |
| 2007/0290192 A1 | 12/2007 | Rotondaro | |
| 2008/0233691 A1 | 9/2008 | Cheng et al. | |
| 2009/0194788 A1* | 8/2009 | Liu | H01L 21/26506 257/190 |
| 2009/0283828 A1* | 11/2009 | Clark et al. | 257/347 |
| 2010/0012975 A1 | 1/2010 | Pal et al. | |
| 2010/0163939 A1* | 7/2010 | Kronholz | H01L 21/823807 257/288 |
| 2010/0207175 A1* | 8/2010 | Suryagandh | H01L 29/66636 257/288 |
| 2010/0219450 A1 | 9/2010 | Kim et al. | |
| 2011/0084319 A1* | 4/2011 | Zhu et al. | 257/288 |

\* cited by examiner

*Primary Examiner* — Michael Lebentritt
*Assistant Examiner* — Jordan Klein
(74) *Attorney, Agent, or Firm* — Jacqueline J. Garner; Frank D. Cimino

(57) ABSTRACT

An integrated circuit contains a transistor with a stress enhancement region on the source side only. In a DeMOS transistor, forming the stress enhancement region on the source side only and not forming a stress enhancement region in the drain extension increases the resistance of the drain extension region enabling formation of a DeMOS transistor with reduced area. In a MOS transistor, by forming the stress enhancement region on the source side only and eliminating the stress enhancement region from the drain side, transistor leakage is reduced and CHC reliability improved.

3 Claims, 4 Drawing Sheets

MOSFET WITH SOURCE SIDE ONLY STRESS

CROSS REFERENCE TO RELATED APPLICATIONS

This application is a divisional of U.S. Nonprovisional patent application Ser. No. 13/288,170, and claims the benefit of U.S. Provisional Application No. 61/409,586, filed Nov. 3, 2010, the entirety of which is herein incorporated by reference.

FIELD OF THE INVENTION

This invention relates to the field of integrated circuits. More particularly, this invention relates stress enhancement of transistors in integrated circuits.

BACKGROUND OF THE INVENTION

It is well known that compressive stress enhances the performance of PMOS transistors and tensile stress enhances the performance of NMOS transistors. Consequently, PMOS transistors with SiGe stress enhancement source and drain regions and NMOS transistors with SiC stress enhancement source and drain regions have been developed. A recess is etched into the silicon in the source and drain regions and the recess is then refilled with epitaxially grown SiGe in for PMOS transistors or SiC for NMOS transistors. Although this process improves transistor performance it also introduces defects that give rise to higher transistor off state leakage and also causes higher electric fields in the channel region that exacerbates channel hot carrier generation degrading transistor reliability. It is therefore desirable to develop a process that takes advantage of the transistor improvement with stress enhancement while significantly reducing the detrimental effects.

When stress enhancement is used in drain extended MOS (DeMOS) transistors, it lowers the sheet resistance of the drain extension. A DeMOS transistor with stress enhanced source and drains therefore requires more area to achieve the equivalent resistance of a DeMOS transistor without stress enhancement. It is desirable to develop a process for DeMOS transistors that benefits from stress enhancement and has the same area as a DeMOS without stress enhancement.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to a MOS or DeMOS transistor with a stress enhancement region on the source side of the transistor only.

DETAILED DESCRIPTION

Figure 1:
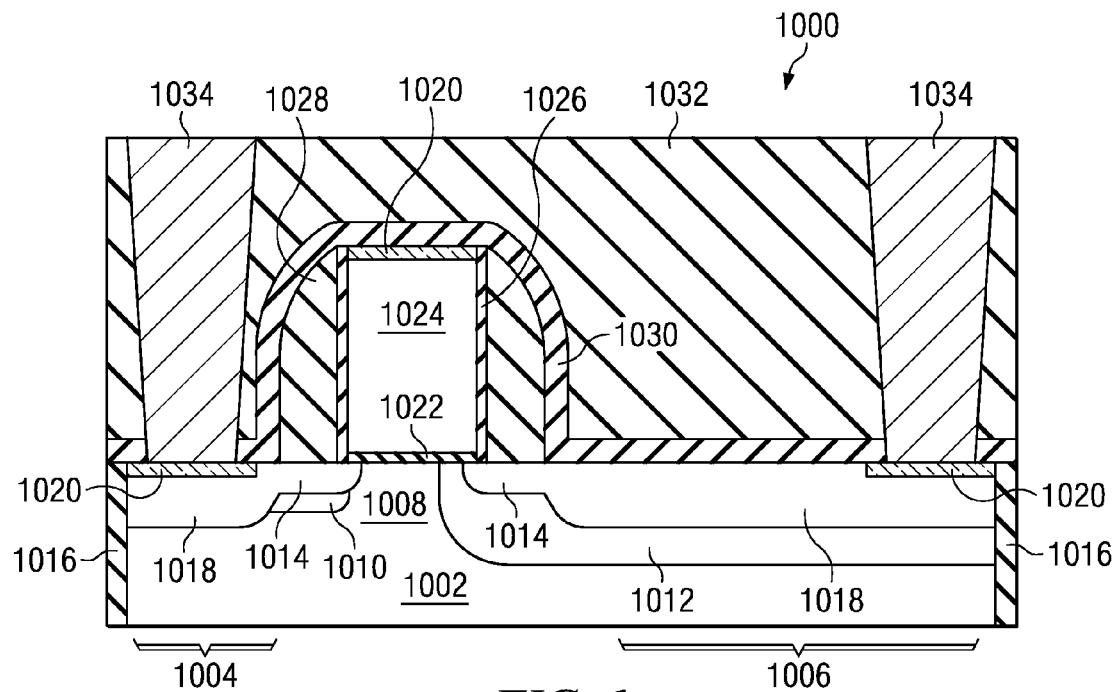
FIG. 1 is a cross-sectional view of a drain extended MOS transistor according to an embodiment of the invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Stress enhancement is used to improve the performance of MOS transistors. Compressive stress when applied to the channel region of a PMOS transistor enhances the mobility of hole carriers improving PMOS transistor performance. Tensile stress when applied to the channel region of a NMOS transistor enhances the mobility of electron carriers improving the NMOS transistor performance. One method of applying stress to the channel region is to etch a recess into the silicon in the source and drain regions and then to epitaxially grow and refill the recessed region with a stress enhancement material such as SiGe in the case of PMOS or SiC in the case of NMOS.

Because of the difference in the crystal lattice spacing of SiGe or SiC compared to the crystal lattice spacing of single crystal silicon some mismatch occurs causing crystal lattice defects. These defects cause an increased undesirable leakage that is especially a problem when the drain is biased to Vdd. In addition the interface region between single crystal silicon and the epitaxially grown SiGe or SiC is a region with a large dopant gradient and with a high electric field. This high electric field enhances channel hot carrier (CHC) formation in the drain region causing CHC reliability degradation.

Another transistor type that receives substantial benefit from this invention is the drain extended MOS transistor (DeMOS). In a DeMOS transistor, voltage is dropped across a high resistance drain extension region between the transistor and the drain contact. This voltage drop enables a DeMOS transistor to switch a higher voltage than a MOS transistor without the high resistivity drain extension. A problem arises when the stress enhancement material is grown in the extended drain region. The stress enhancement material increases mobility of the carriers causing a lowering of resistance which is opposite to the desired high resistance. In addition, the stress enhancement material is typically grown with added dopant which also undesirably reduces resistance in the DeMOS drain extension region. The lower resistance caused by the stress enhancement material in this region requires the layout of a longer drain extionsion region that consumes more area.

FIG. 1 shows a Drain Extended MOS (DeMOS) transistor structure 1000 with a stress enhancement region only on the source side. The DeMOS transistor includes a n-type substrate 1002, a source region 1004, an extended drain region 1006, shallow trench isolation (STI) regions 1016, a channel region 1008, a source side SiGe stress enhancement region 1010, a pwell region 1012, source and drain extension regions 1014, source and drain diffusion regions 1018, silicide regions 1020, a gate dielectric 1022, a transistor gate 1024, offset sidewall spacer 1026, sidewall spacers 1028, contact etch stop liner 1030, dielectric 1032 and contacts 1034. There is a SiGe stress enhancement region 1010 on the source side 1004 of the DeMOS transistor 1000 but no stress enhancement region on the extended drain side 1006. This enables the area of this stress enhanced DeMOS transistor to be essentially the same as the area of a DeMOS transistor without stress enhancement because of the omission of the stress enhancement from the drain extension region. Another benefit of omitting the SiGe stress enhancement region from the drain side of the transistor is to reduce off current of the transistor because defects that are formed during the stress enhancement process are avoided. Although FIG. 1 shows a PMOS DeMOS transistor which is the preferred embodiment, the instant invention may also be used for a NMOS DeMOS transistor.

Figure 2:
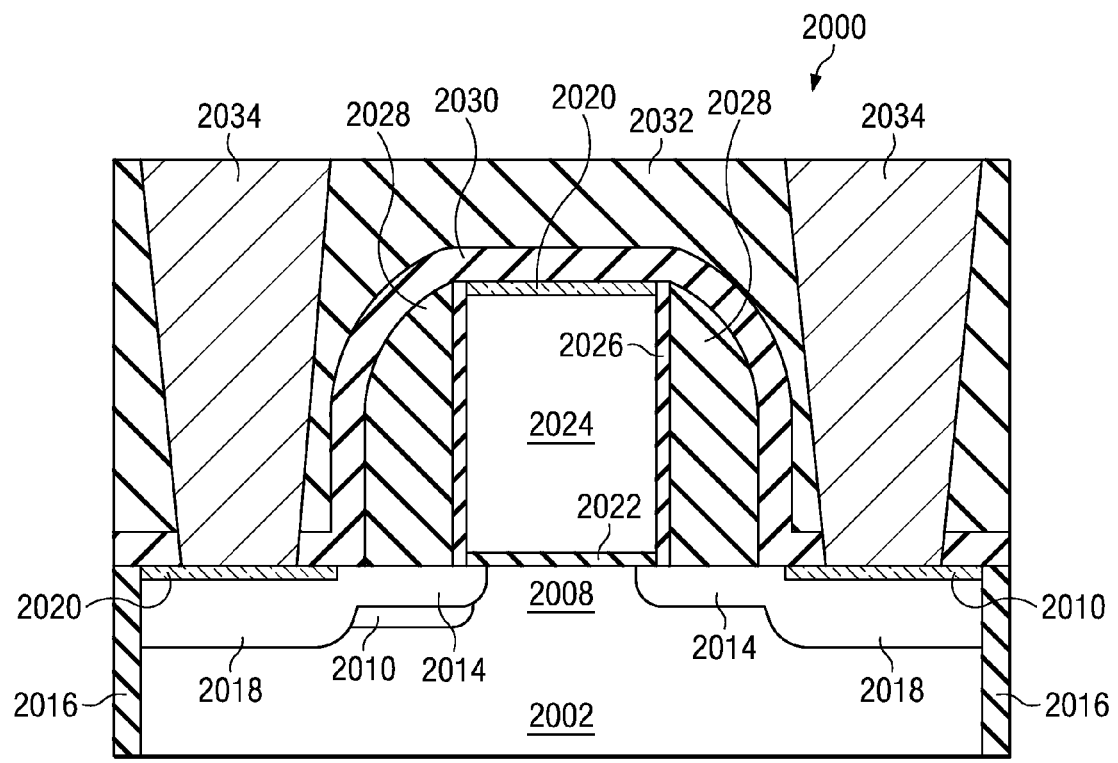
FIG. 2 is a cross-sectional view MOS transistor according to an embodiment of the invention.

FIG. 2 shows a MOS transistor structure 2000 as taught by this invention. The MOS transistor includes a substrate 2002, STI regions 2016, a channel region 2008, a source side stress enhancement region 2010, source and drain extension regions 2014, source and drain diffusion regions 2018, silicide regions 2020, a gate dielectric 2022, a transistor gate 2024, offset spacer 2026, sidewall spacers 2028, contact etch stop liner 2030, dielectric layer 2032, and contacts 2034. The stress enhancement region 2010 may be SiGe in the case of a PMOS transistor or SiC in the case of a NMOS transistor. Omission of the stress enhancement region from the drain side of a MOS transistor improves transistor off current because defects that may form during the stress enhancement region formation process are avoided. The channel hot carrier reliability is also improved because the large electric field that may be caused by the large dopant gradient that may form at the interface between the stress enhancement material and the silicon substrate is eliminated. With the stress enhancement region 2010 removed from the drain side of the transistor, improvement of the transistor performance due to stress is reduced by about 5% to 10% when compared to a transistor with stress enhancement regions 2010 on both of the source and drain sides.

Figure 3A:
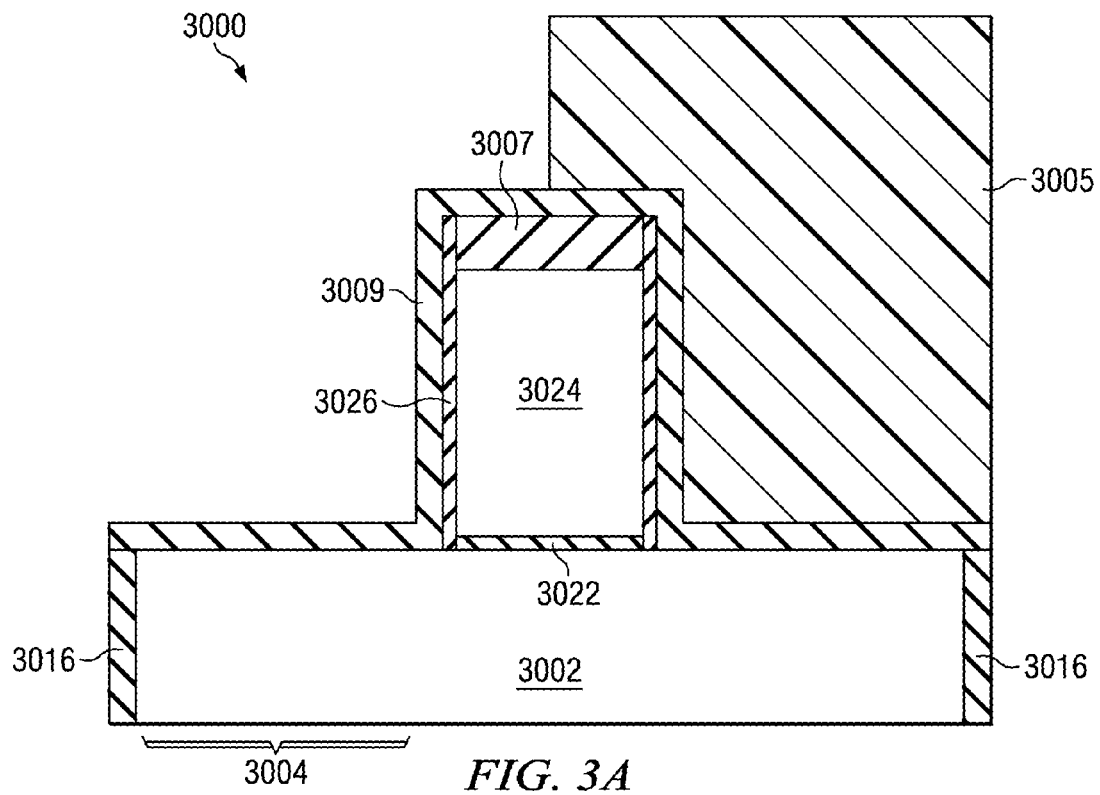
FIG. 3A through 3F are cross-sectional views of a MOS transistor at various stages of manufacture according to embodiments of the invention.

FIGS. 3A through 3F are illustrations of the steps in the fabrication of an integrated circuit incorporating this invention. FIG. 3A shows a MOS transistor structure that has been partially processed through gate formation 3018. The MOS transistor. The MOS transistor structure includes a substrate 3002, STI regions 3016, a gate dielectric 3022, a transistor gate 3024, a gate capping layer 3007, and offset sidewalls 3026. A layer of masking material 3005 has been deposited to form a mask for the silicon recess etch and for the epitaxial growth of the stress enhancement material. The preferred embodiment for the masking material is RTCVD silicon nitride approximately 10 nm in thickness. Gate capping layer 3007 prevents the gate material from becoming exposed during the etch of the masking layer 3009. When the gate material is polysilicon, gate capping layer 3007 prevents the silicon recess etch from removing polysilicon from the gate and prevents the epitaxial growth of stress enhancement material on the polysilicon of the gate. The capping material 3009 may for example, be silicon nitride or silicon oxynitride ranging from 10 nm to 40 nm thickness. Photoresist pattern 3005 has been formed over the integrated circuit 3000 to open only the source side 3004 of the transistor.

Figure 3B:
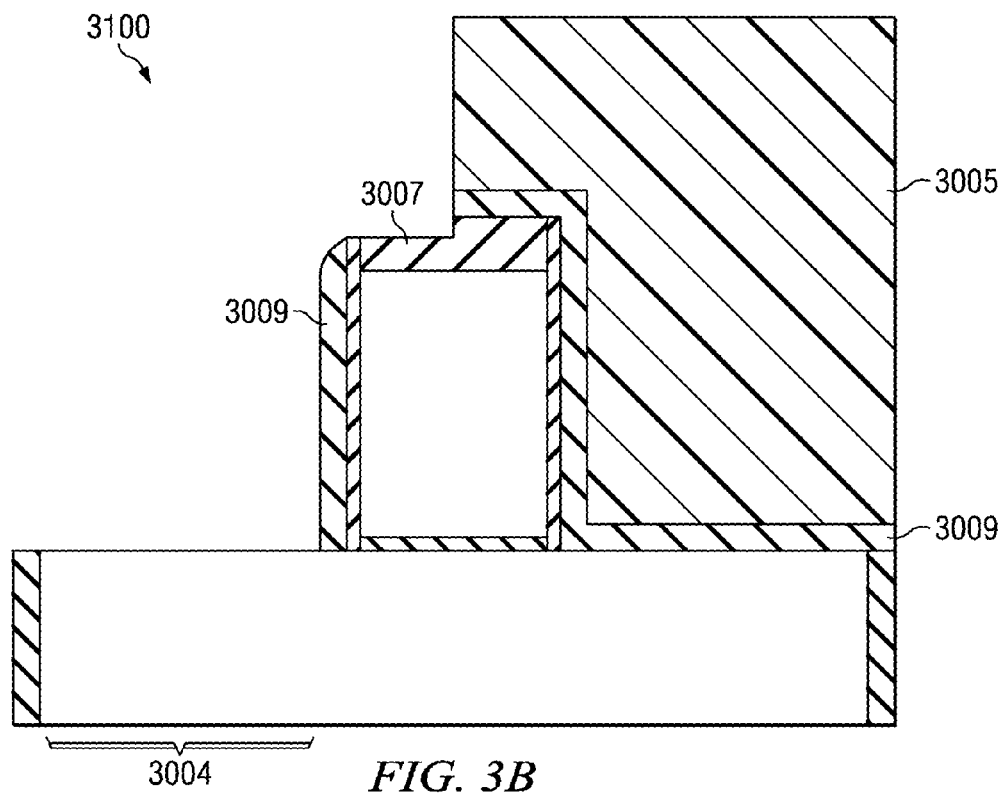

FIG. 3B shows the structure after the masking layer 3009 is etched. The pattern protects the masking material 3009 over the drain so that the masking material 3009 is removed from the source side 3004 of the transistor only. The gate cap material 3007 is sufficiently thick to prevent the gate material from being exposed post etch.

Figure 3C:
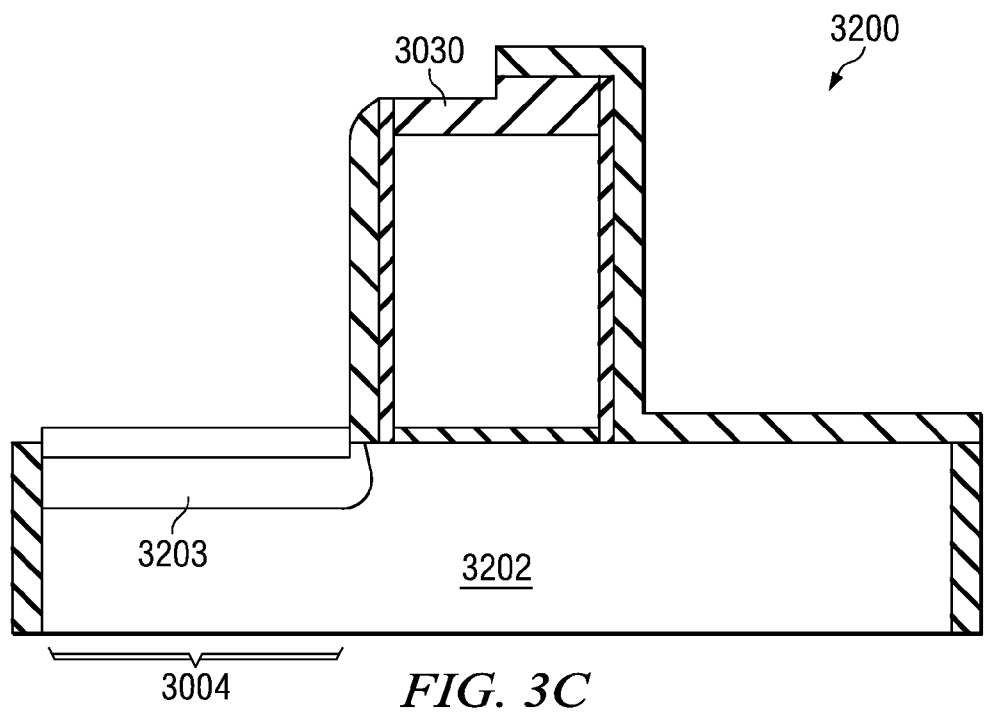

FIG. 3C shows the transistor structure 3200 after a recess 3203 has been etched into the silicon substrate 3002 on the source side of the transistor. The recess 3203 is formed using, for example, a dry etching process such as the chemistry employed to etch STI trenches. The recess 3203 is etched into the semiconductor substrate 3002 to a depth of about 50 to 80 nm, for example, with the preferred depth being 60 to 65 nm.

Figure 3D:
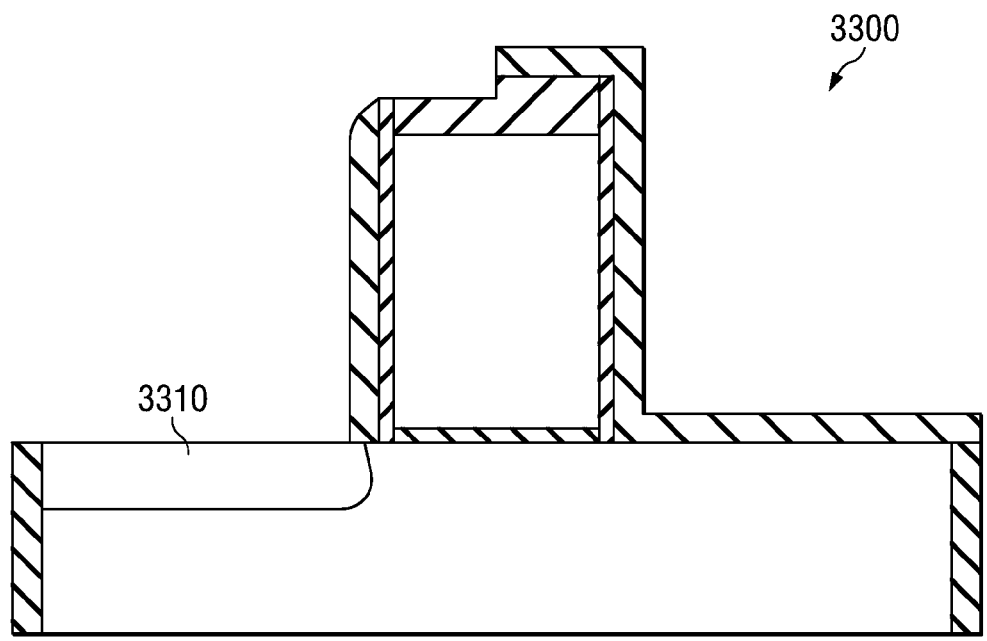

As shown in FIG. 3D, stress enhancement material 3310 has been epitaxially grown to fill the recessed silicon area 3203. In a PMOS transistor example, stress enhancement material 3310 may be silicon germanium epitaxially grown to fill the recessed silicon area 3203 using a selective epitaxial deposition process such as LPCVD (low pressure chemical vapor deposition) at a temperature of approximately 650° C. to 700° C. using dichlorosilane and germane as the source gases. The SiGe stress enhancement material 3310 in the PMOS transistor is doped with p-type dopant either by in-situ doping during the SiGe deposition or by implantation post SiGe deposition. The preferred method is in-situ doping by incorporation of a p-type dopant reactant such as diborane for example during the CVD process. The in-situ doping of SiGe is preferred because it is believed that in-situ dopants are activated to a higher degree than implanted dopants. The germanium content of the SiGe is in the range of 5 to 40% depending upon the technology node with the preferred range being 22% to 32% for 32 nm. In an NMOS transistor example embodiment, stress enhancement material 3310 may be silicon carbide epitaxially grown at a temperature of approximately 575° C. to 650° C. to form silicon carbide with preferably 1% to 2.5% substitutional carbon. The carbon must be substitional and not interstitial to provide the desired stress enhancement.

Figure 3E:
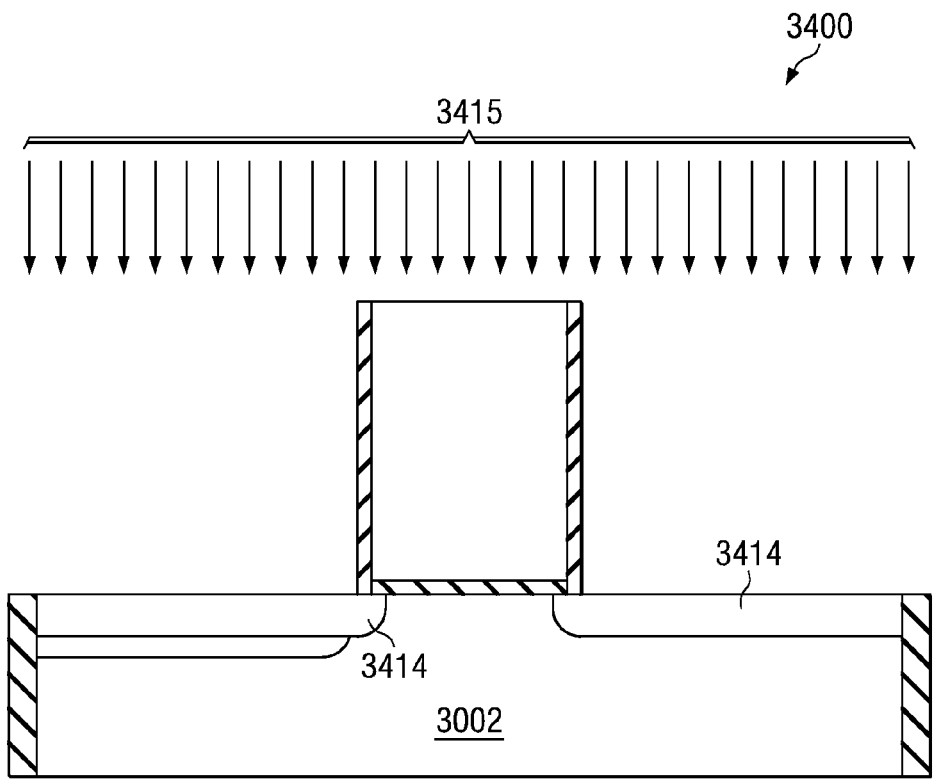

FIG. 3E shows the transistor structure after the masking layer 3009 and gate capping layer 3007 have been removed. A typical method to remove the masking layer 3009 is a hot phosphoric acid bath of 155° C. to 165° C. temperature followed by an SC1 clean (NH4OH, H2O2, H2O) to remove particles. A photoresist pattern may then be formed on the integrated circuit 3400 and dopant 3415 implanted to form source and drain extensions 3414.

Figure 3F:
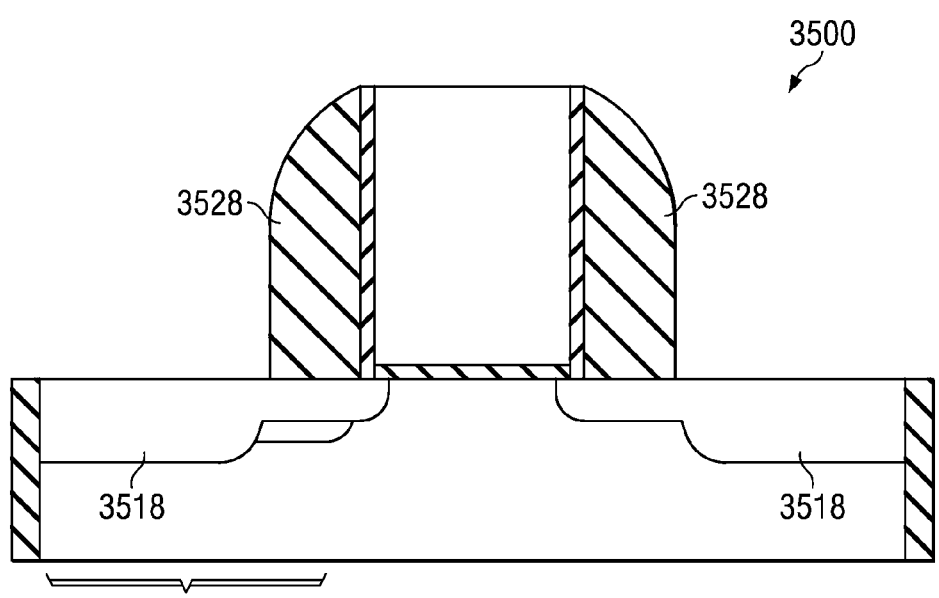

Conventional processing is then used to add sidewall spacers 3528 and form the source 3004 and drain diffusions 3518 as shown in FIG. 3F. Additional conventional processing is then used to silicide the source, drain, and gate regions, to deposit dielectric layers, to form contacts, and to form metal interconnect layers to complete the integrated circuit.

Not forming the stress enhancement region in the drain extension in a DeMOS transistor (FIG. 1) has the benefit of increasing the resistance of the drain extension region enabling formation of a DeMOS transistor 1000 with reduced area.

A stress enhancement region 2010 only on the source side of a MOS transistor 2000 (FIG. 2), boosts transistor performance by about 80% to 90% when compared to a MOS transistor with stress enhancement regions on both the source and drain sides. By eliminating the stress enhancement region from the drain side, transistor leakage is substantially reduced and CHC reliability substantially improved.

Various additional modifications to the invention as described above are within the scope of the claimed invention. As an example, instead of forming the stress enhancement region before the source and drain extension regions are in place, the stress enhancement region may be formed after the source and drain extension regions.

It is also within the scope of this invention to add stress to the source region and not the drain region by implanting a stress enhancing species into the source side only and annealing the implant. For example, this could be carbon for NMOS or Sn for PMOS.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit having a transistor with stress enhancement on a source side only, comprising;
    providing a semiconductor substrate having a gate formed thereon;
    forming a pattern on said semiconductor substrate opening a source region adjacent to said gate;
    implanting said source region with a stress enhancing species;
    annealing said implant; and
    subsequently forming a source diffusion in the source region and a drain diffusion in a region.
2. The method of claim 1 wherein said transistor is NMOS and said stress enhancing species is carbon.
3. The method of claim 1 wherein said transistor is PMOS and said stress enhancing species is Sn.

* * * * *